(12) United States Patent
Lim et al.

(10) Patent No.: US 8,963,227 B2
(45) Date of Patent: Feb. 24, 2015

(54) SEMICONDUCTOR DEVICES HAVING A DIFFUSION BARRIER LAYER AND METHODS OF MANUFACTURING THE SAME

(71) Applicant: Samsung Electronics Co., Ltd., Suwon-si (KR)

(72) Inventors: Ha-Jin Lim, Seoul (KR); Jin-Ho Do, Hwaseong-si (KR); Weon-Hong Kim, Suwon-si (KR); Moon-Kyun Song, Anyang-si (KR); Dae-Kwon Joo, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/049,570

(22) Filed: Oct. 9, 2013

(65) Prior Publication Data

US 2014/0035050 A1 Feb. 6, 2014

Related U.S. Application Data

(62) Division of application No. 13/191,948, filed on Jul. 27, 2011, now Pat. No. 8,563,411.

(30) Foreign Application Priority Data

Aug. 3, 2010 (KR) .................. 10-2010-0074878

(51) Int. Cl.
*H01L 29/76* (2006.01)
*H01L 29/78* (2006.01)
*H01L 21/28* (2006.01)
*H01L 21/8238* (2006.01)
*H01L 27/108* (2006.01)
*H01L 29/49* (2006.01)

(52) U.S. Cl.
CPC .......... *H01L 29/78* (2013.01); *H01L 21/28088* (2013.01); *H01L 21/823842* (2013.01); *H01L 21/823857* (2013.01); *H01L 27/10873* (2013.01); *H01L 27/10894* (2013.01); *H01L 29/4966* (2013.01)
USPC ...... 257/314; 257/315; 257/369; 257/E25.01; 257/E21.35

(58) Field of Classification Search
CPC ................ H01L 21/823842; H01L 21/823821
USPC .............. 257/314, 315, 369, E25.01, E21.35
See application file for complete search history.

(56) References Cited

U.S. PATENT DOCUMENTS

| | | | |
|---|---|---|---|
| 2004/0106249 A1 | 6/2004 | Huotari | |
| 2005/0258468 A1* | 11/2005 | Colombo et al. | 257/314 |
| 2009/0218634 A1 | 9/2009 | Sakashita et al. | |
| 2009/0263950 A1 | 10/2009 | Koyama et al. | |
| 2010/0102395 A1* | 4/2010 | Yamamoto et al. | 257/369 |

FOREIGN PATENT DOCUMENTS

| | | |
|---|---|---|
| JP | 2009-194352 | 8/2009 |
| KR | 10-2009-0042196 | 4/2009 |
| KR | 10-2009-0081346 | 7/2009 |

* cited by examiner

*Primary Examiner* — Julia Slutsker
(74) *Attorney, Agent, or Firm* — Myers Bigel Sibley & Sajovec, P.A.

(57) ABSTRACT

Methods of manufacturing a semiconductor device include forming a gate insulation layer including a high-k dielectric material on a substrate that is divided into a first region and a second region; forming a diffusion barrier layer including a first metal on a second portion of the gate insulation layer in the second region; forming a diffusion layer on the gate insulation layer and the diffusion barrier layer; and diffusing an element of the diffusion layer into a first portion of the gate insulation layer in the first region.

17 Claims, 9 Drawing Sheets

SEMICONDUCTOR DEVICES HAVING A DIFFUSION BARRIER LAYER AND METHODS OF MANUFACTURING THE SAME

CLAIM OF PRIORITY

This application is a divisional of U.S. patent application Ser. No. 13/191,948, filed on Jul. 27, 2011, issuing as U.S. Pat. No. 8,563,411 on Oct. 22, 2013, and claims priority to Korean Patent Application No. 10-2010-0074878, filed on Aug. 3, 2010 in the Korean Intellectual Property Office (KIPO), the contents of which are incorporated herein by reference in their entireties.

BACKGROUND

1. Field

The inventive concept relates generally to semiconductor devices and methods of manufacturing the same, and more particularly, to semiconductor devices having a gate insulation layer including a high-k material and a diffusion barrier layer.

2. Description of the Related Art

In order to reduce a leakage current through a gate insulation layer of a transistor, a method of forming the gate insulation layer using a high-k material has been developed. However, when a gate electrode including polysilicon is formed directly on the gate insulation layer including the high-k material, the transistor may have an increased threshold voltage and decreased electron mobility due to the Fermi-level pinning effect. Thus, gate electrodes having a metal rather than polysilicon have been developed.

SUMMARY

In some embodiments, methods of manufacturing a semiconductor device include forming a gate insulation layer including a high-k dielectric material on a substrate that is divided into a first region and a second region; forming a diffusion barrier layer including a first metal on a second portion of the gate insulation layer in the second region; forming a diffusion layer on the gate insulation layer and the diffusion barrier layer; and diffusing an element of the diffusion layer into a first portion of the gate insulation layer in the first region.

In some embodiments, the diffusion layer comprises a material selected from the group consisting of lanthanum, lanthanum oxide, yttrium, terbium, erbium, aluminum, aluminum oxide, tantalum, tantalum oxide and combinations thereof.

In some embodiments, diffusing an element of the diffusion layer into the first portion of the gate insulation layer in the first region comprises performing a thermal annealing process on the substrate to diffuse the element of the diffusion layer into the first portion of the gate insulation layer in the first region.

In some embodiments, the diffusion layer is removed and a gate electrode including a second metal on the gate insulation layer and the diffusion barrier layer is formed.

In some embodiments, the diffusion barrier layer is formed using a material selected from the group consisting of titanium, titanium nitride, tungsten, tungsten nitride, tantalum, tantalum nitride, tantalum silicide or ruthenium.

In some embodiments, the first region is an NMOS transistor region in which an NMOS transistor is formed, and the second region is a PMOS transistor region in which a PMOS transistor is formed. In some embodiments, the diffusion layer is formed using lanthanum or lanthanum oxide.

In some embodiments, the first region is a PMOS transistor region in which a PMOS transistor is formed, and the second region is an NMOS transistor region in which an NMOS transistor is formed. In some embodiments, the diffusion layer is formed using aluminum or aluminum oxide.

In some embodiments, forming a gate electrode layer includes forming a metal layer on the gate insulation layer and the diffusion barrier layer using the second metal; and forming a silicon layer on the metal layer opposite the gate insulation layer. In some embodiments, the silicon layer is formed using amorphous silicon or polysilicon.

In some embodiments, the gate insulation layer is formed using a metal oxide or a metal silicon oxide. In some embodiments, the gate insulation layer is formed using any one selected from the group consisting of hafnium oxide, zirconium oxide, tantalum oxide, aluminum oxide, lanthanum oxide, hafnium silicon oxide, zirconium silicon oxide or tantalum silicon oxide. In some embodiments, forming the gate insulation layer includes: forming a low-k dielectric layer on the substrate; and forming a high-k dielectric layer on the low-k dielectric layer opposite the substrate.

In some embodiments, the gate electrode layer, the diffusion barrier layer and the gate insulation layer are patterned to form a first gate structure in the first region and a second gate structure in the second region. The first gate structure includes a first gate insulation layer pattern and a first gate electrode, and the second gate structure includes a second gate insulation layer pattern, a diffusion barrier layer pattern and a second gate electrode.

In some embodiments, a semiconductor device includes a substrate having a first region and a second region and a first gate structure on the first region of the substrate. The first gate structure includes a first gate insulation layer pattern including a first material comprising a high-k dielectric material and a second material that is diffused in the high-k dielectric material; and a first gate electrode on the first gate insulation layer. A second gate structure on the second region of the substrate includes a second gate insulation layer pattern including the high-k dielectric material; a diffusion barrier layer pattern on the second gate insulation layer pattern; and a second gate electrode on the diffusion barrier layer pattern.

In some embodiments, the second material diffused in the high-k dielectric material of the first gate insulation layer is selected from the group consisting of lanthanum, lanthanum oxide, yttrium, terbium, erbium, aluminum, aluminum oxide, tantalum, tantalum oxide and combinations thereof.

In some embodiments, the diffusion barrier layer pattern comprises a first metal, and the first gate electrode and the second gate electrode comprise a second metal.

In some embodiments, each of the first and second gate electrodes includes a metal layer pattern on the substrate and a polysilicon pattern on the metal layer pattern opposite the substrate.

In some embodiments, a semiconductor device comprises a substrate having a first region and a second region and a first gate structure in the first region. The first gate structure includes a first gate insulation layer pattern; and a first gate electrode on the first gate insulation layer pattern opposite the substrate. A second gate structure is in the second region, and the second gate structure includes a second gate insulation layer pattern; a diffusion barrier layer pattern on the second gate insulation layer pattern opposite the substrate; and a second gate electrode on the diffusion barrier layer pattern opposite the substrate.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

DESCRIPTION OF EMBODIMENTS ACCORDING TO THE INVENTIVE CONCEPT

The inventive concept will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
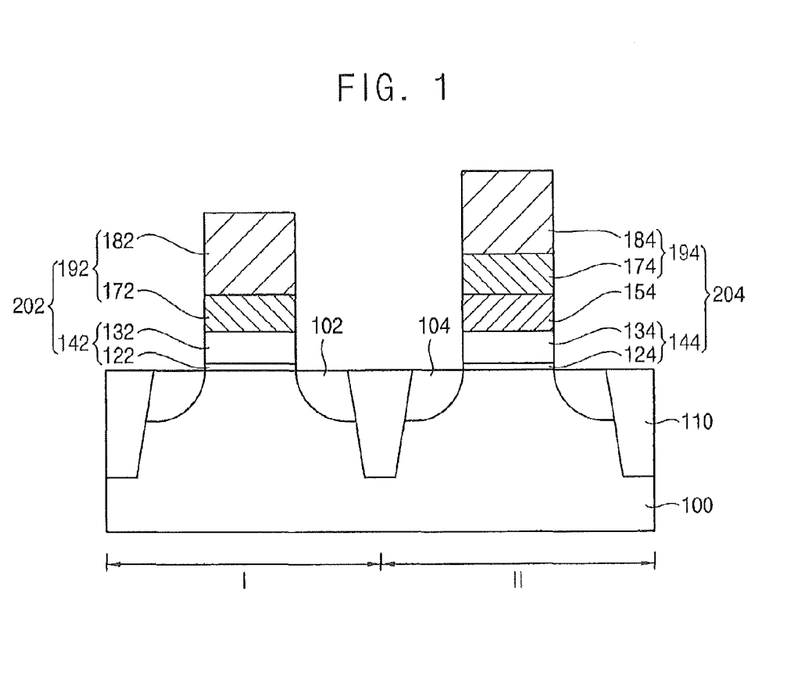
FIG. 1 is a cross-sectional view illustrating a semiconductor device in accordance with the inventive concept.

FIG. 1 is a cross-sectional view illustrating a semiconductor device in accordance with some embodiments.

Referring to FIG. 1, the semiconductor device may include an NMOS transistor on a substrate 100 in a first region I and a PMOS transistor on the substrate 100 in a second region II. The substrate 100 may include a silicon substrate, a germanium substrate or a silicon-on-insulator (SOI) substrate. A p-type well (not shown) including p-type impurities may be formed at a portion of the substrate 100 in the first region I, and a n-type well (not shown) including n-type impurities may be formed at a portion of the substrate 100 in the second region II. An isolation layer 110 may be formed on the substrate 100 to define an active region and a field region in the substrate 100.

The NMOS transistor may include a first gate structure 202 on the substrate 100 in the first region I and a first source/drain region 102 at an upper portion of the substrate 100 adjacent to the first gate structure 202. In some embodiments, the NMOS transistor may further include a spacer (not shown) on a sidewall of the first gate structure 202.

The first gate structure 202 may include a first gate insulation layer pattern 142 and a first gate electrode 192 sequentially stacked on the substrate 100. The first gate insulation layer pattern 142 may include a first low-k dielectric layer pattern 122 and a first high-k dielectric layer pattern 132, and the first gate electrode 192 may include a first metal layer pattern 172 and a first silicon layer pattern 182.

In some embodiments, the first source/drain region 102 may include n-type impurities such as phosphorous.

The PMOS transistor may include a second gate structure 204 on the substrate 100 in the second region II and a second source/drain region 104 at an upper portion of the substrate 100 adjacent to the second gate structure 204. Additionally, the PMOS transistor may further include a spacer (not shown) on a sidewall of the second gate structure 204.

The second gate structure 204 may include a second gate insulation layer pattern 144, a diffusion barrier layer pattern 154 and a second gate electrode 194 sequentially stacked on the substrate 100. The second gate insulation layer pattern 144 may include a second low-k dielectric layer pattern 124 and a second high-k dielectric layer pattern 134, and the second gate electrode 194 may include a second metal layer pattern 174 and a second silicon layer pattern 184.

In some embodiments, the second source/drain region 104 may include p-type impurities such as boron or other suitable impurities.

The first and second low-k dielectric layer patterns 122 and 124 may include silicon oxide or silicon oxynitride.

The first high-k dielectric layer pattern 132 may include a high-k dielectric material in which a material, such as lanthanum or titanium, is diffused, and the second high-k dielectric layer pattern 134 may include a high-k dielectric material in which the material diffused in the first high-k dielectric layer pattern 132 is substantially not diffused or absent. In some embodiments, lanthanum or titanium is diffused in the first high-k dielectric layer pattern 132, but is substantially not diffused in the second high-k dielectric pattern. The high-k dielectric material may include a metal oxide or a metal oxynitride. For example, the high-k dielectric material may include hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, hafnium lanthanum oxide, zirconium aluminum oxide, aluminum oxynitride, hafnium aluminum oxynitride, hafnium lanthanum oxynitride, or zirconium aluminum oxynitride, either alone or in combinations thereof.

In some embodiments of the inventive concept, the diffusion barrier layer pattern 154 may include a metal or a metal nitride. For example, the diffusion barrier layer pattern 154 may include any suitable material having a high electrical conductivity such as titanium, titanium nitride, tungsten, tungsten nitride, tantalum nitride, titanium aluminum nitride.

The first and second metal layer patterns 172 and 174 may include a metal, a metal nitride or a metal silicide. For example, the first and second metal layer patterns 172 and 174 may include molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride or titanium aluminum nitride. In some embodiments of the inventive concept, the first and second metal layer patterns 172 and 174 may include a material substantially the same as that of the diffusion barrier layer pattern 154.

The first and second silicon layer patterns 182 and 184 may include polysilicon or amorphous silicon. In some embodiments, the first silicon layer pattern 182 may include n-type impurities such as phosphorous, and the second silicon layer pattern 184 may include p-type impurities such as boron.

The first and second high-k dielectric layer patterns 132 and 134 of the semiconductor device may include a high-k dielectric material, and lanthanum or titanium is diffused in the first high-k dielectric layer pattern 132 of the NMOS transistor. Thus, the NMOS transistor may have a low leakage current and a low threshold voltage.

Figure 2:
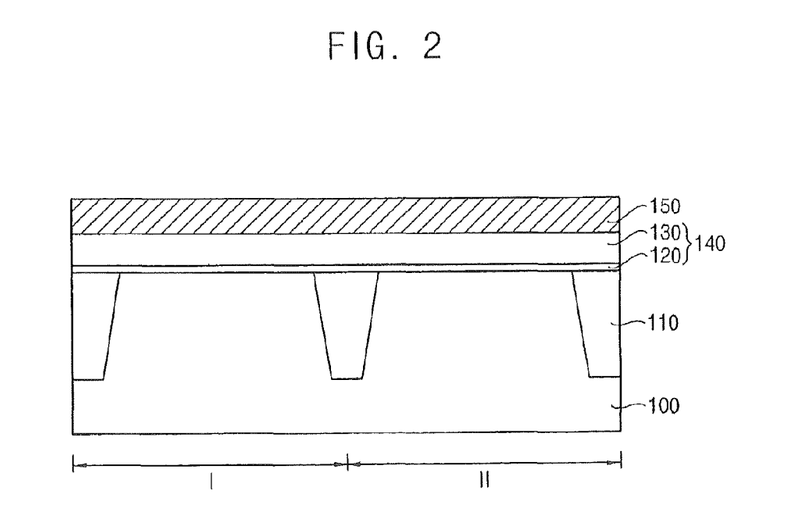
FIGS. 2 to 5 are cross-sectional views of a semiconductor device illustrating methods of manufacturing the semiconductor device in accordance with the inventive concept.

Referring to FIG. 2, a gate insulation layer 140 and a diffusion barrier layer 150 may be sequentially formed on a substrate 100 including an isolation layer pattern 110 thereon.

The substrate 100 may include a silicon substrate, a germanium substrate or a SOI substrate, and the substrate 100 may be divided into a first region I and a second region II. In some embodiments according to the inventive concept, a negative-channel metal oxide semiconductor (NMOS) transistor may be formed on the substrate 100 in the first region I and a positive-channel metal oxide semiconductor (PMOS) transistor may be formed on the substrate 100 in the second region II. A p-type well (not shown) may be further formed at a portion of the substrate 100 in the first region I by doping p-type impurities thereinto. An n-type well (not shown) may be further formed at a portion of the substrate 100 in the second region II by doping n-type impurities thereinto. In some embodiments, the isolation layer pattern 110 may be formed by a shallow trench isolation (STI) process so that an active region and a field region may be defined in the substrate 100.

The gate insulation layer 140 may be formed using a high-k dielectric material. In some embodiments according to the inventive concept, the gate insulation layer 140 may be formed by sequentially forming a low-k dielectric layer 120 and a high-k dielectric layer 130 on the substrate 100.

The low-k dielectric layer 120 may be formed using silicon oxide or silicon oxynitride or other suitable low-k dielectric material. In some embodiments, the low-k dielectric layer 120 may be formed such that it includes silicon oxide by performing a thermal oxidation process on an upper surface of the substrate 100. Alternatively, the low-k dielectric layer 120 may be formed such that it includes silicon oxynitride by further performing a plasma nitration process or a thermal nitration process on the upper surface of the substrate 100.

The high-k dielectric layer 130 may be formed using a metal oxide or a metal oxynitride having a high dielectric constant by a chemical vapor deposition (CVD) process, an atomic layer deposition (ALD) process or a sputtering process. In some embodiments, the high-k dielectric layer 130 may be formed using hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, hafnium lanthanum oxide, zirconium aluminum oxide, aluminum oxynitride, hafnium aluminum oxynitride, hafnium lanthanum oxynitride, zirconium aluminum oxynitride, either alone or in combinations thereof.

The diffusion barrier layer 150 may be formed using a metal. For example, in some embodiments, the diffusion barrier layer 150 may be formed using a metal having a high electrical conductivity, such as titanium, titanium nitride, tungsten, tungsten nitride, tantalum nitride, titanium aluminum nitride, by a CVD process, an ALD process or a sputtering process. The diffusion barrier layer 150 may be formed to have a single-layered structure or a multi-layered structure.

Figure 3:
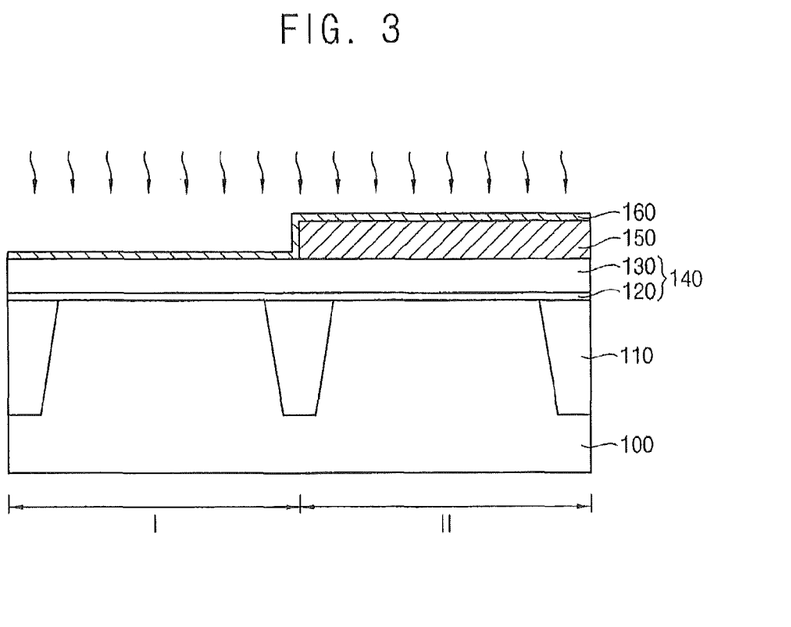

Referring to FIG. 3, a portion of the diffusion barrier layer 150 in the first region I may be removed so that the diffusion barrier layer 150 may remain only in the second region II and a first portion of the high-k dielectric layer 130 in the first region I may be exposed. In some embodiments, the portion of the diffusion barrier layer 150 in the first region I may be removed by a photolithography process using a photoresist pattern (not shown) such as an etching mask.

A diffusion layer 160 may be formed on the exposed first portion of the high-k dielectric layer 130 in the first region I and the diffusion barrier layer 150 in the second region II. The diffusion layer 160 may be formed using lanthanum, lanthanum oxide, yttrium (Y), terbium (Tb) or erbium (Er) by a CVD process, an ALD process or a sputtering process.

A thermal annealing process may be performed on the substrate 100 and the diffusion layer 160, the diffusion barrier layer 150 and the gate insulation layer 140. The thermal annealing process may be performed at a temperature of about 800 to about 1100° C.

Figure 4:
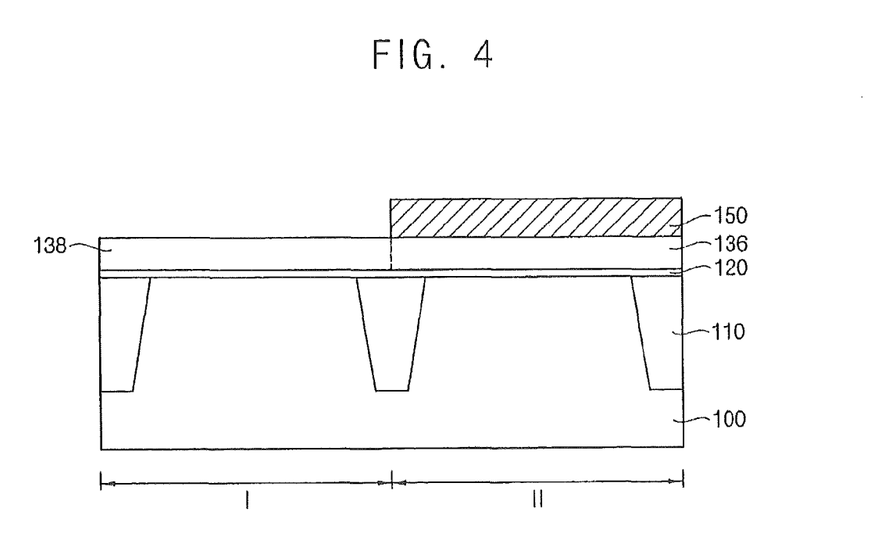

Referring to FIG. 4, during the thermal annealing process, an element of the diffusion layer 160 may be diffused into the exposed first portion of the high-k dielectric layer 130 in the first region I. In some embodiments, the element of the diffusion layer 160 is substantially not diffused to the low-k dielectric layer 120 due to the presence of the diffusion barrier layer 150 between the diffusion layer 160 and the high-k dielectric layer 130. Hereinafter, the first portion of the high-k dielectric layer 130 in the first region I in which the element of the diffusion layer 160 may be diffused may be defined as a first high-k dielectric layer 138, and the second portion of the high-k dielectric layer 130 in the second region II in which the element of the diffusion layer 160 may not be diffused may be defined as a second high-k dielectric layer 136.

In some embodiments, the NMOS transistor having the first high-k dielectric layer 138 in which the element of the diffusion layer 160 is diffused may have a low threshold voltage.

After the thermal annealing process is performed, the diffusion layer 160 remaining on the first high-k dielectric layer 138 and the diffusion barrier layer 150 may be removed. Accordingly, excessive diffusion of the element of the diffusion layer 160 may be reduced or prevented so that the electron mobility of the NMOS transistor may not be reduced. For example, the remaining portion of the diffusion layer 160 may be removed by a stripping process or an etching process.

Figure 5:
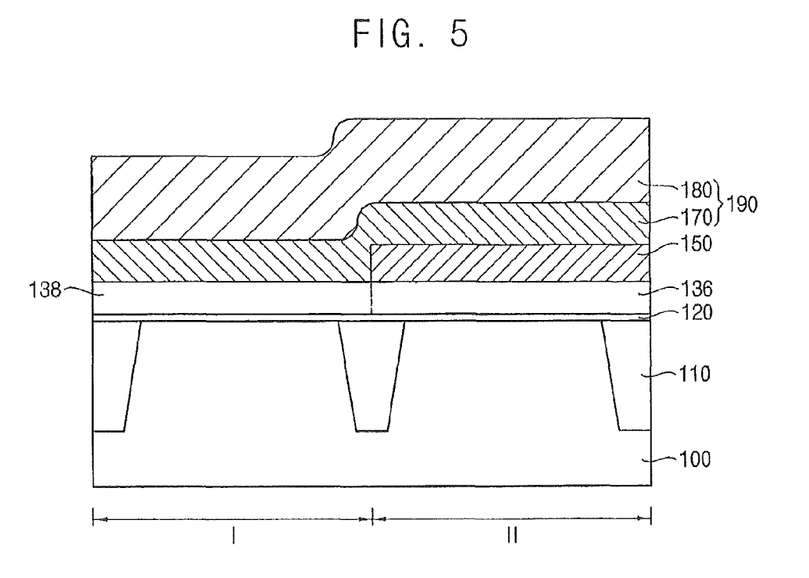

Referring to FIG. 5, a gate electrode layer 190 may be formed on the first high-k dielectric layer 138 and the diffusion barrier layer 150. In some embodiments, the gate electrode layer 190 may be formed using a metal. For example, the gate electrode layer 190 may be formed by sequentially stacking a metal layer 170 and a silicon layer 180 on the first high-k dielectric layer 138 and the diffusion barrier layer 150.

The metal layer 170 may be formed using a metal, a metal nitride, a metal silicide by a CVD process, an ALD process or a sputtering process. For example, the metal layer 170 may be formed using molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride or titanium aluminum nitride. In some embodiments, the metal layer 170 may be formed using a material substantially the same as that of the diffusion barrier layer 150.

In some embodiments, the metal layer 170 may be formed between the first high-k dielectric layer 138 and the silicon layer 180 so that direct contact between the silicon layer 180 and the first high-k dielectric layer 138 is substantially prevented, thereby reducing or preventing the Fermi-level pinning effect.

The silicon layer 180 may be formed using polysilicon or amorphous silicon by a CVD process, an ALD process or a sputtering process. In some embodiments, the silicon layer 180 may be formed to include impurities. For example, n-type impurities may be doped in a portion of the silicon layer 180 in the first region I, and p-type impurities may be doped in a portion of the silicon layer 180 in the second region II.

Referring to FIG. 1 again, the silicon layer 180, the metal layer 170, the diffusion barrier layer 150, the first and second high-k dielectric layers 138 and 136 and the low-k dielectric layer 120 may be sequentially patterned to form the first gate structure 202 on the substrate 100 in the first region I and the second gate structure 204 on the substrate 100 in the second region II.

The first gate structure 202 may include a first gate insulation layer pattern 142 and a first gate electrode 192 sequentially stacked on the substrate 100. The first gate insulation layer pattern 142 may include a first low-k dielectric layer pattern 122 and a first high-k dielectric layer pattern 132, and the first gate electrode 192 may include a first metal layer pattern 172 and a first silicon layer pattern 182.

The second gate structure 204 may include a second gate insulation layer pattern 144, a diffusion barrier layer pattern 154 and a second gate electrode 194. The second gate insulation layer pattern 144 may include a second low-k dielectric layer pattern 124 and a second high-k dielectric layer pattern 134, and the second gate electrode 194 may include a second metal layer pattern 174 and a second silicon layer pattern 184.

Impurities may be doped in an upper portion of the substrate 100 by an ion implantation process using the first and second gate structures 202 and 204 as ion implantation masks. In some embodiments, a first source/drain region 102 including first impurities may be formed at an upper portion of the substrate 100 in the first region I, and a second source/drain region 104 including second impurities may be formed at an upper portion of the substrate 100 in the second region II. For example, the first impurities may be n-type impurities such as phosphorous and the second impurity may be p-type impurities such as boron.

Semiconductor devices according to some embodiments of the inventive concept may be manufactured by performing processes described above.

According to some embodiments, the diffusion barrier layer 150 including a metal may be formed on the gate insulation layer 140 of the PMOS transistor and the diffusion layer 160 may be formed on the gate insulation layer 140 of the NMOS transistor and the diffusion barrier layer 150, such that elements of the diffusion layer 160 may be diffused into the gate insulation layer 140 of the NMOS transistor. Thus, the NMOS transistor may have a low leakage current and a low threshold voltage. Subsequently, the remaining portion of the diffusion layer 160 may be removed so that the electron mobility of channel regions of the transistors may not be reduced, thereby improving the operation speed of the transistors.

In some embodiments of the inventive concept, the metal layer 170 may be formed before the silicon layer 180 is formed on the high-k dielectric layer 130, thereby preventing the Fermi-level pinning effect. Furthermore, the silicon layer 180 may be formed after the thermal annealing process rather than before the annealing process, and thus any volume change difference between the silicon layer 180 and the gate insulation layer 140 due to the thermal annealing process may be reduced or prevented. Accordingly, a gate undercut may be reduced or prevented.

As described above, the first high-k dielectric layer pattern 132 of the semiconductor device may include a high-k dielectric material having lanthanum or titanium diffused therein; however, it should be understood that any suitable material may be used as the diffusion layer 160 and an element thereof diffused in the high-k dielectric layer of the first high-k dielectric layer pattern 132 according to embodiments of the inventive concept. For example, the diffusion layer 160 may be formed of lanthanum, lanthanum oxide, yttrium, terbium, erbium, aluminum, aluminum oxide, tantalum, tantalum oxide and combinations thereof, and an element of the diffusion layer 160 may be diffused in the high-k dielectric layer as described herein. Moreover, although embodiments of the present inventive concept are described above with respect to the diffusion barrier layer 150 including a metal may being formed on the gate insulation layer 140 of a PMOS transistor and the diffusion layer 160 being formed on the gate insulation layer 140 of the NMOS transistor and the diffusion barrier layer 150, such that elements of the diffusion layer 160 may be diffused into the gate insulation layer 140 of the NMOS transistor, it should be understood that elements of the diffusion layer 160 may be diffused into a gate insulation layer of a PMOS transistor, and an NMOS transistor may be formed that includes the diffusion barrier layer pattern 150.

Figure 6:
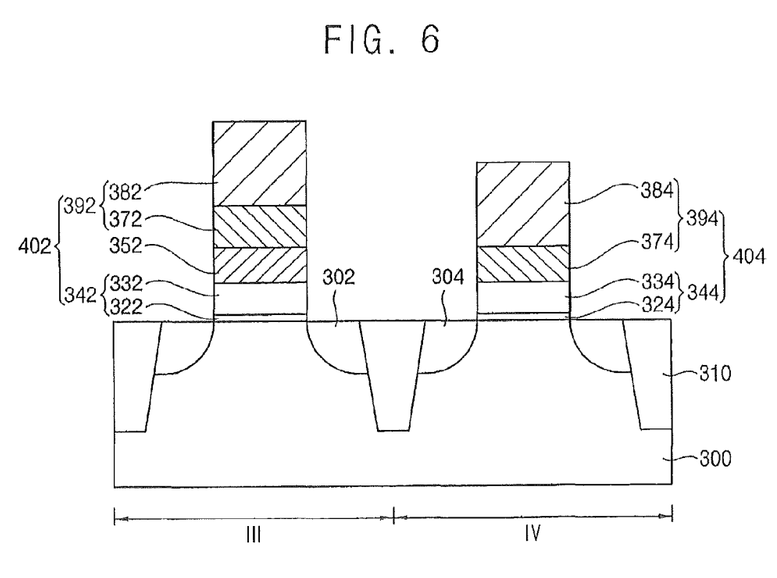
FIG. 6 is a cross-sectional view illustrating a semiconductor device in accordance with the inventive concept.

For example, FIG. 6 is a cross-sectional view illustrating a semiconductor device in accordance to embodiments of the present inventive concept in which the semiconductor device may be substantially the same as or similar to the semiconductor device illustrated with reference to FIG. 1 except that an NMOS transistor includes a diffusion barrier layer pattern.

Referring to FIG. 6, the semiconductor device may include an NMOS transistor on a substrate 300 in a first region III and a PMOS transistor on the substrate 300 in a second region IV. The NMOS transistor may include a first gate structure 402 on the substrate 300 in the first region III and a first source/drain region 302 at an upper portion of the substrate 300 adjacent to the first gate structure 402.

The first gate structure 402 may include a first gate insulation layer pattern 342, a diffusion barrier layer pattern 352 and a first gate electrode 392 sequentially stacked on the substrate 300. The first gate insulation layer pattern 342 may include a first low-k dielectric layer pattern 322 and a first high-k dielectric layer pattern 332, and the first gate electrode 392 may include a first metal layer pattern 372 and a first silicon layer pattern 382.

In some embodiments, the first source/drain region 302 may include n-type impurities such as phosphorous.

The PMOS transistor may include a second gate structure 404 on the substrate 300 in the second region IV and a second source/drain region 304 at an upper portion of the substrate 300 adjacent to the second gate structure 404.

The second gate structure 404 may include a second gate insulation layer pattern 344 and a second gate electrode 394 sequentially stacked on the substrate 300. The second gate insulation layer pattern 344 may include a second low-k dielectric layer pattern 324 and a second high-k dielectric layer pattern 334, and the second gate electrode 394 may include a second metal layer pattern 374 and a second silicon layer pattern 384.

In some embodiments, the second source/drain region 304 may include p-type impurities such as boron. The first and second low-k dielectric layer pattern 322 and 324 may include silicon oxide or silicon oxynitride.

According to some embodiments of the present inventive concept, the second high-k dielectric layer pattern 334 may include a high-k dielectric layer in which a material such as aluminum is diffused, and the first high-k dielectric layer pattern 332 may include a high-k dielectric material in which the material diffused in the second high-k dielectric layer pattern 334 is substantially not diffused. The high-k dielectric material may include a metal oxide or a metal oxynitride.

The diffusion barrier layer pattern 352 may include a metal or a metal nitride. In some embodiments, the diffusion barrier layer pattern 352 may include a material having a high electric conductivity such as titanium, titanium nitride, tungsten, tungsten nitride, tantalum nitride or titanium aluminum nitride.

The first and second metal layer pattern 372 and 374 may include a metal, a metal nitride or a metal silicide. The first and second silicon layer patterns 382 and 384 may include polysilicon or amorphous silicon. In some embodiments, the first silicon layer pattern 382 may include n-type impurities such as phosphorous, and the second silicon layer pattern 384 may include p-type impurities such as boron.

According to some embodiments, the first and second high-k dielectric layer pattern 332 and 334 of the semiconductor device may include a high-k dielectric material, and aluminum may be diffused in the second high-k dielectric layer pattern 334 of the PMOS transistor. Thus, the PMOS transistor may have a low leakage current and a high threshold voltage.

FIGS. 7 to 10 are cross-sectional views illustrating a method of manufacturing a semiconductor device in accordance with some embodiments. The method may be substantially the same or similar to the method illustrated with reference to FIGS. 2 to 5, except that a diffusion barrier layer is formed on an NMOS transistor, and thus detailed explanations thereabout may be omitted here.

Figure 7:
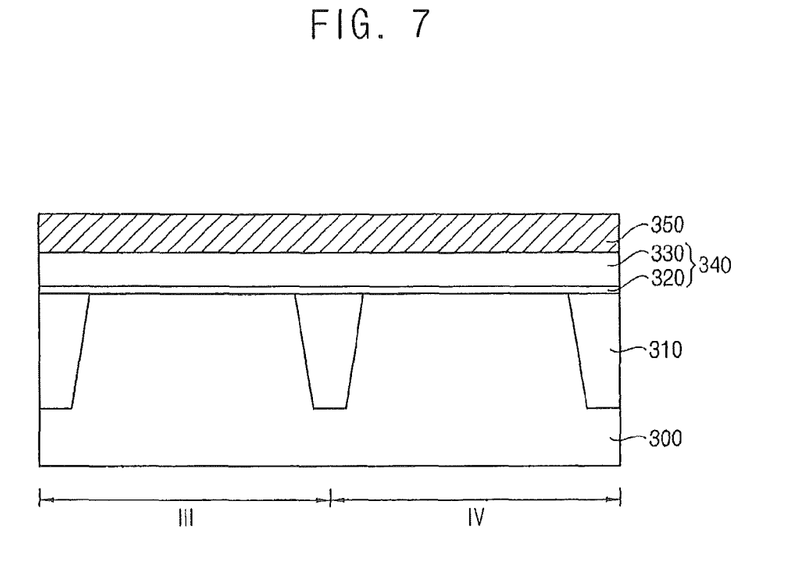
FIGS. 7 to 10 are cross-sectional views of a semiconductor device illustrating methods of manufacturing the semiconductor device in accordance with the inventive concept.

Referring to FIG. 7, a gate insulation layer 340 and a diffusion barrier layer 350 may be sequentially formed on a substrate 300 including an isolation layer structure 310 thereon. In some embodiments, an NMOS transistor may be formed on the substrate 300 in a first region III and a PMOS transistor may be formed on the substrate in a second region IV.

The gate insulation layer 340 may be formed using a high-k dielectric layer material. In some embodiments, the gate insulation layer 340 may be formed by sequentially forming a low-k dielectric layer 320 and a high-k dielectric layer 330 on the substrate 300.

The low-k dielectric layer 320 may be formed using silicon oxide or silicon oxynitride. The high-k dielectric layer 330 may be formed using a metal oxide or a metal oxynitride having a high dielectric constant by a CVD process, an ALD process or a sputtering process.

The diffusion barrier layer 350 may be formed using a metal. In some embodiments, the diffusion barrier layer 350 may have a single-layered structure or a multi-layered structure including a metal or a metal nitride. For example, the diffusion barrier layer 350 may be formed using a material having a high electrical conductivity such as titanium, titanium nitride, tungsten, tungsten nitride, tantalum nitride, titanium aluminum nitride by a CVD process, an ALD process or a sputtering process.

Figure 8:
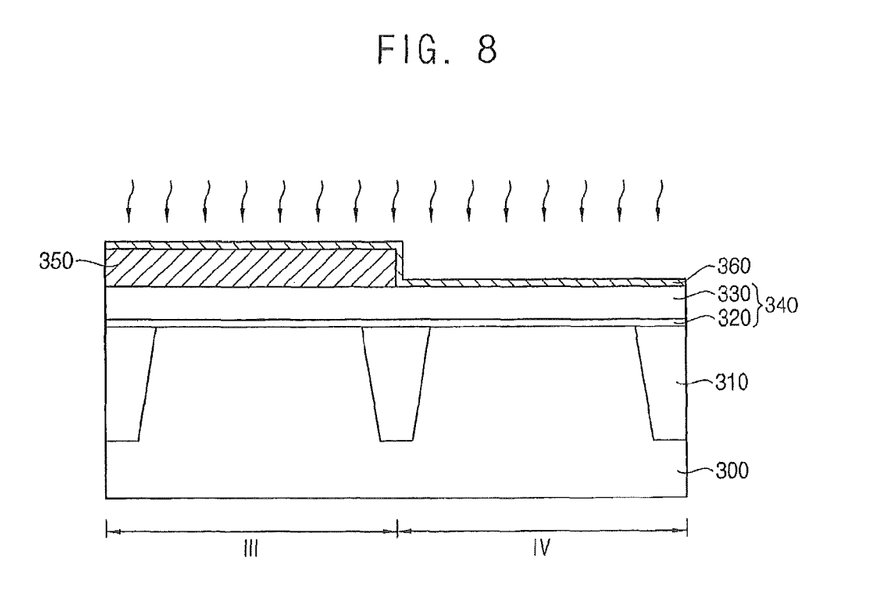

Referring to FIG. 8, a portion of the diffusion barrier layer 350 in the second region II may be removed so that the diffusion barrier layer 350 may remain only in the first region III and a first portion of the high-k dielectric layer 330 in the second region IV may be exposed.

A diffusion layer 360 may be formed on the exposed portion of the high-k dielectric layer 330 in the second region IV and the diffusion barrier layer 350 in the first region III. The diffusion layer 360 may be formed using aluminum, aluminum oxide by a CVD process, an ALD process or a sputtering process.

A thermal annealing process may be performed on the substrate 300 including the diffusion layer 360, the diffusion barrier layer 350 and the gate insulation layer 340. The thermal annealing process may be performed at a temperature of about 800 to 1000° C.

Figure 9:
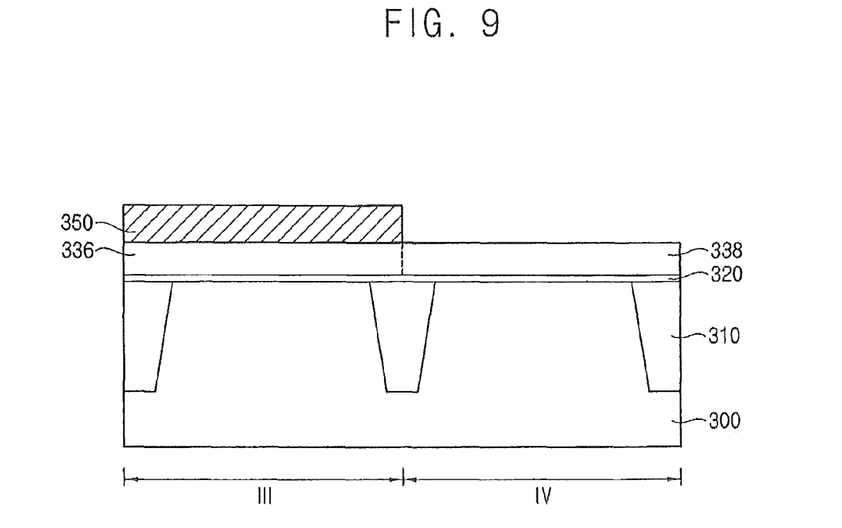

Referring to FIG. 9, an element of the diffusion layer 360 may be diffused into the exposed first portion of the high-k dielectric layer 330 in the second region IV during the thermal annealing process. In some embodiments, diffusion of the element of the diffusion layer 360 into a second portion of the high-k dielectric layer 330 in the first region III may be reduced or substantially prevented, e.g., due to the diffusion barrier layer 360 between the diffusion layer 360 and the high-k dielectric layer 330. Hereinafter, the first portion of the high-k dielectric layer 330 in the second region IV in which the element of the diffusion layer 360 may be diffused may be defined as a second high-k dielectric layer 338, and the first portion of the high-k dielectric layer 330 in the first region III in which the element of the diffusion layer 360 may not be diffused may be defined as a first high-k dielectric layer 336.

The PMOS transistor having the second high-k dielectric layer 338 in which the element of the diffusion layer 360 is diffused may have a high threshold voltage.

After the thermal annealing process is performed, the diffusion layer 360 remaining on the second high-k dielectric layer 338 and the diffusion barrier layer 350 may be removed. Thus, the element of the diffusion layer 360 may not diffuse excessively so that an electron mobility of the PMOS transistor may not be reduced. The remaining portion of the diffusion layer 360 may be removed by a stripping process or an etching process.

Figure 10:
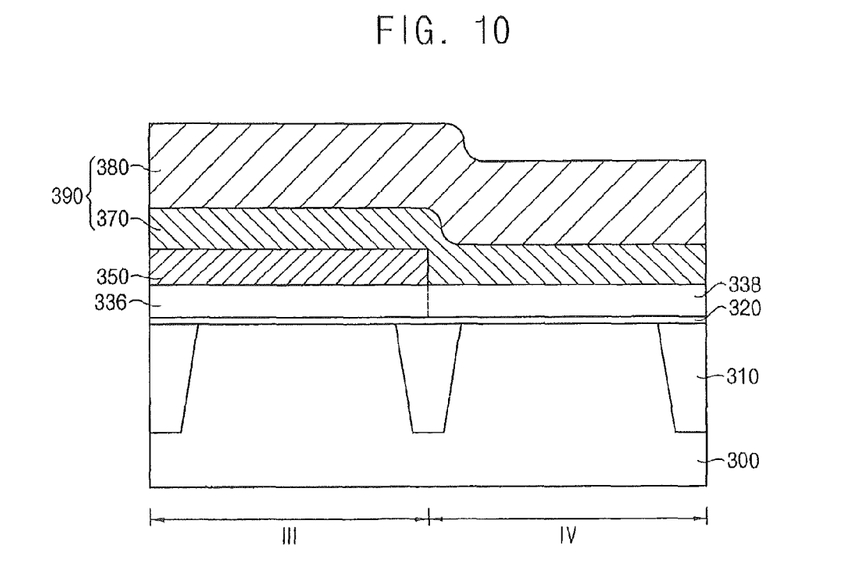

Referring to FIG. 10, a gate electrode layer 390 may be formed on the second high-k dielectric layer 338 and the diffusion barrier layer 350. The gate electrode layer 390 may be formed using a metal. In some embodiments, the gate electrode layer 390 may be formed by sequentially stacking a metal layer 370 and a silicon layer 380 on the second high-k dielectric layer 338 and the diffusion barrier layer 350. The metal layer 370 may be formed using a metal, a metal nitride, a metal silicide by a CVD process, an ALD process or a sputtering process. In some embodiments, the metal layer 370 may be formed using a material substantially the same as that of the diffusion barrier layer 350.

In some embodiments, the metal layer 370 may be formed between the second high-k dielectric layer 338 and the silicon layer 380 so that the silicon layer 380 may not directly contact the second high-k dielectric layer 338, thereby preventing the Fermi-level pinning effect.

The silicon layer 380 may be formed using polysilicon or amorphous silicon by a CVD process, an ALD process or a sputtering process. In some embodiments, the silicon layer 380 may be formed to include impurities. For example, n-type impurities may be doped in a portion of the silicon layer 380 in the first region III, and p-type impurities may be doped in a portion of the silicon layer 380 in the second region IV.

Referring to FIG. 6 again, the silicon layer 380, the metal layer 370, the diffusion barrier layer 350, the first and second high-k dielectric layers 336 and 338 and the low-k dielectric layer 320 may be sequentially patterned to form a first gate structure 402 on the substrate 300 in the first region III and a second gate structure 404 on the substrate 300 in the second region IV.

The first gate structure 402 may include a first gate insulation layer pattern 342, a diffusion barrier layer pattern 352 and a first gate electrode 392 sequentially stacked on the substrate 300. The first gate insulation layer pattern 342 may include a first low-k dielectric layer pattern 322 and a first high-k dielectric layer pattern 332, and the first gate electrode 392 may include a first metal layer pattern 372 and a first silicon layer pattern 382.

The second gate structure 404 may include a second gate insulation layer pattern 344 and a second gate electrode 394. The second gate insulation layer pattern 344 may include a second low-k dielectric layer pattern 324 and a second high-k dielectric layer pattern 334, and the second gate electrode 394 may include a second metal layer pattern 374 and a second silicon layer pattern 384.

Impurities may be doped in an upper portion of the substrate 300 by an ion implantation process using the first and second gate structures 402 and 404 as ion implantation masks. In some embodiments, a first source/drain region 302 including first impurities may be formed at an upper portion of the substrate 300 in the first region III, and a second source/drain region 304 including second impurities may be formed at an upper portion of the substrate 300 in the second region IV. For example, the first impurities may be n-type impurities such as phosphorous and the second impurity may be p-type impurities such as boron.

The semiconductor device may be manufactured by performing processes described above.

According to some embodiments of the present inventive concept, the diffusion barrier layer 350 including a metal may be formed on the gate insulation layer 340 of the NMOS transistor and the diffusion layer 360 may be formed on the gate insulation layer 340 of the PMOS transistor and the diffusion barrier layer 350 of the NMOS transistor, such that the element of the diffusion layer 360 may be diffused into the gate insulation layer 340 of the PMOS transistor. Thus, the PMOS transistor may have a low leakage current and a high threshold voltage. Subsequently, the remaining portion of the diffusion layer 360 may be removed so as to minimize or prevent a reduction in the electron mobility of channel regions of the transistors, thereby improving the operation speed of the transistors.

Additionally, the metal layer 370 may be formed before the silicon layer 380 is formed on the high-k dielectric layer 330, thereby preventing the Fermi-level pinning effect. Furthermore, the silicon layer 380 may be formed not before but after the thermal annealing process, and thus the volume change difference between the silicon layer 380 and the gate insulation layer 340 due to the thermal annealing process may not occur. Accordingly, a gate undercut may be prevented.

FIGS. 11 to 17 are cross-sectional views illustrating a method of manufacturing a semiconductor device in accordance with some embodiments. Methods of manufacturing the CMOS transistor as illustrated in FIGS. 11 to 17 may be substantially the same as or similar to that illustrated with reference to FIGS. 1 to 5, and thus detailed explanations thereabout is omitted here.

Figure 11:
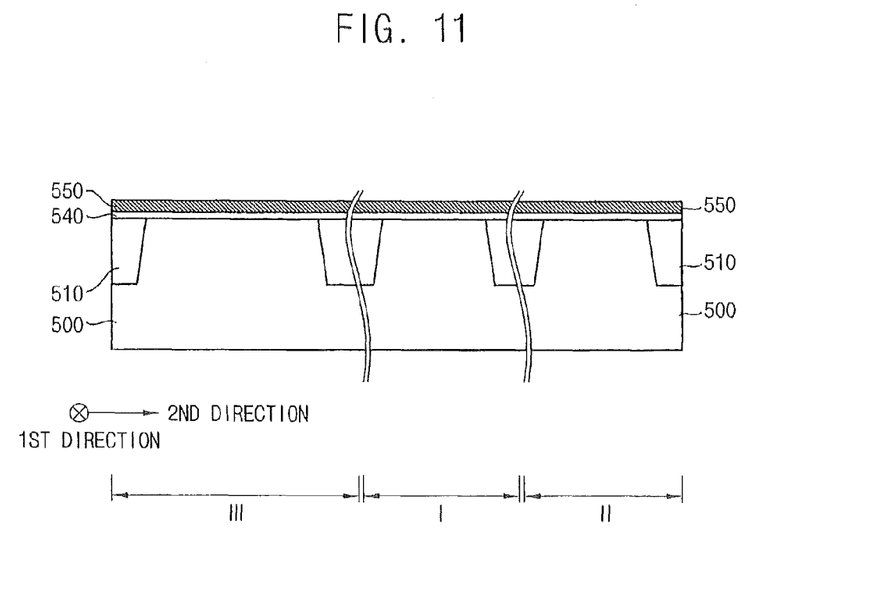
FIGS. 11 to 17 are cross-sectional views of a semiconductor device illustrating methods of manufacturing the semiconductor device in accordance with the inventive concept.

Referring to FIG. 11, an isolation layer 510 may be formed on a substrate 500 that may be divided into a first region I, a second region II and a third region III. The third region III may serve as a cell region, the first region I may serve as an NMOS region of a peripheral circuit region, and the second region II may serve as a PMOS region of the peripheral circuit region.

A gate insulation layer 540 and a diffusion barrier layer 550 may be sequentially formed on the substrate 500 in all of the first to third regions I, II and III. The gate insulation layer 540 may be formed using a high-k dielectric material. In some embodiments, the gate insulation layer 540 may be formed by sequentially forming a low-k dielectric layer (not shown) and a high-k dielectric layer (not shown) on the substrate 500. The low-k dielectric layer may be formed using silicon oxide or silicon oxynitride, and the high-k dielectric layer may be formed a metal oxide or a metal oxynitride having a high dielectric constant. The diffusion barrier layer 550 may have a single-structured layer or a multi-structured layer including a metal or a metal nitride.

Figure 12:
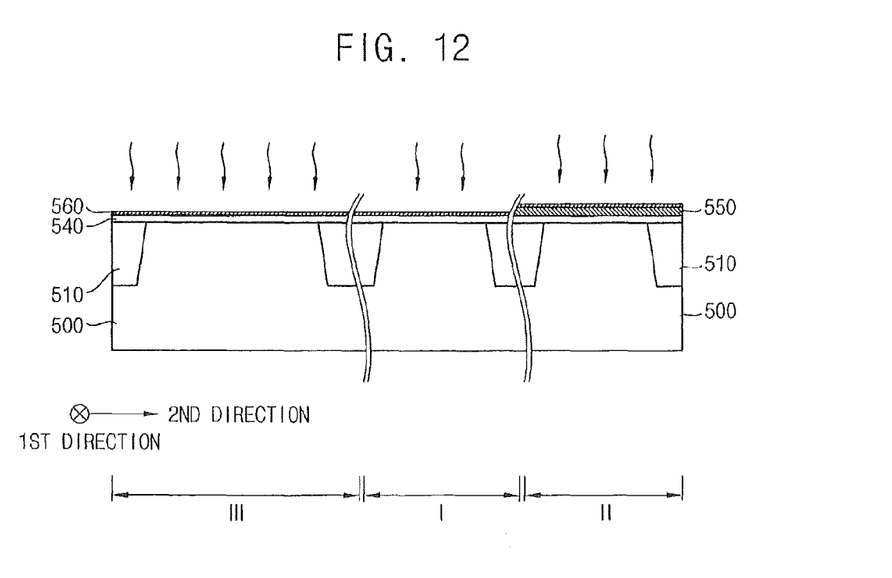

Referring to FIG. 12, portions of the diffusion barrier layer 550 in the first region I and the third region III may be removed so that first and third portions of the gate insulation layer 540 in the first and third regions I and III may be exposed and the diffusion barrier layer 550 may remain only in the second region II.

A diffusion layer 560 may be formed on the exposed first and third portions of the gate insulation layer 540 in the first and third regions I and III and the diffusion barrier layer 550 in the second region II. The diffusion layer 560 may be formed using lanthanum, lanthanum oxide, tantalum or tantalum oxide.

A thermal annealing process may be performed on the substrate 500 including the diffusion layer 560, the diffusion barrier layer 550 and the gate insulation layer 540. The thermal annealing process may be performed at a temperature of about 800 to 1100° C.

Figure 13:
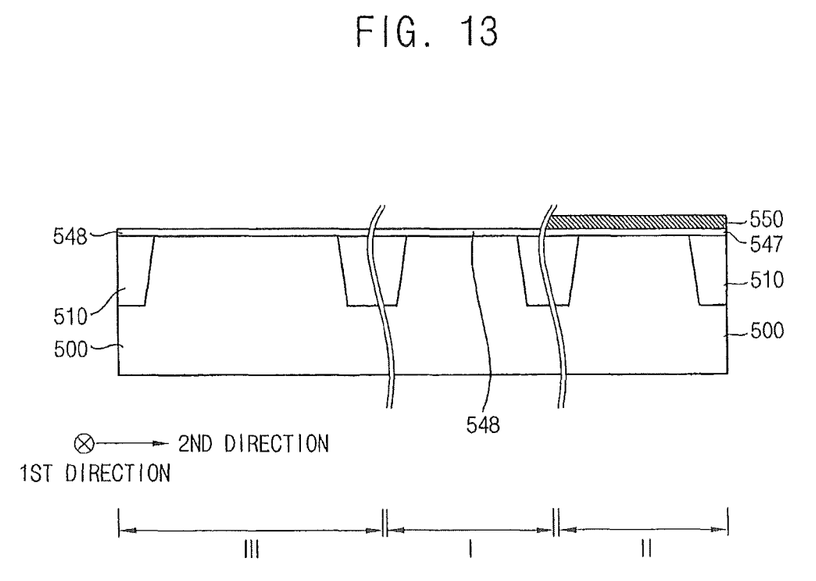

Referring to FIG. 13, an element of the diffusion layer 560 may be diffused in the exposed first and third portions of gate insulation layer 540 in the first and third regions I and III, e.g., during the thermal annealing process. The diffusion barrier layer 550 may reduce or substantially prevent the diffusion of the element of the diffusion layer 560 may in a second portion of the gate insulation layer 540 in the second region II because the diffusion barrier layer 550 may be formed between the diffusion layer 560 and the second portion of the gate insulation layer 540 in the second region II. Hereinafter, the first and third portions of the gate insulation layer 540 in the first and third regions I and III in which the element of the diffusion layer 560 may be diffused may be defined as a first gate insulation layer 548, and the second portion of the gate insulation layer 540 in the second region II in which the element of the diffusion layer 560 may not be diffused may be defined as a second gate insulation layer 547.

In some embodiments, the first gate insulation layer 548 having the element of the diffusion layer 560 diffused therein may substantially prevent an increase of a threshold voltage of the NMOS transistors that may be formed in the first and third regions I and III.

After the thermal annealing process is performed, the diffusion layer 560 remaining on the first gate insulation layer 548 and the diffusion barrier layer 550 may be removed. Thus, diffusion of the element of the diffusion layer 560 may be reduced or substantially prevented after removal so that the electron mobility of the NMOS transistor may not be reduced. The remaining portion of the diffusion layer 560 may be removed by a stripping process or an etching process.

Figure 14:
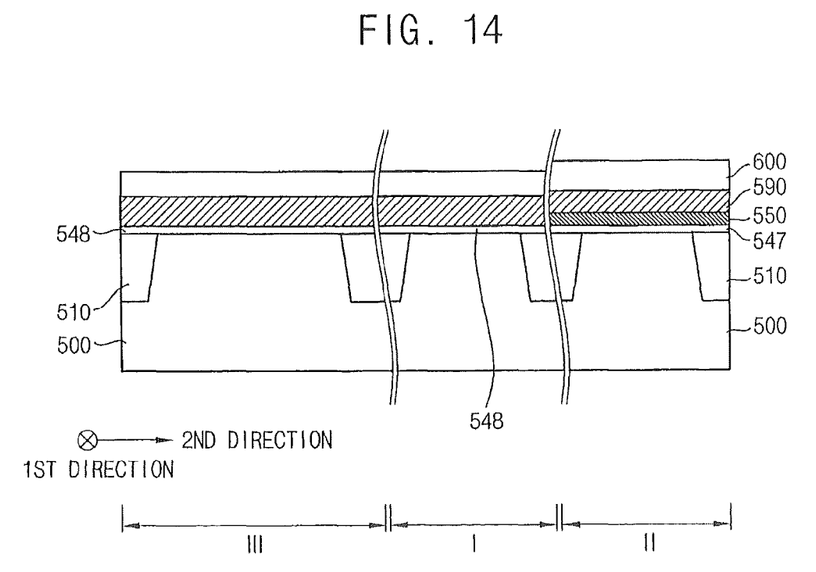

Referring to FIG. 14, a gate electrode layer 590 and a gate mask layer 600 may be sequentially formed on the first gate insulation layer 548 and the diffusion barrier layer 550. The gate electrode layer 590 may be formed by sequentially forming a metal layer (not shown) and a silicon layer (not shown) on the first gate insulation layer 548 and the diffusion barrier layer 550. In this case, the metal layer may be formed between the first gate insulation layer 548 and the silicon layer so that direct contact between the silicon layer and the first gate insulation layer 548 is substantially prevented, thereby preventing the Fermi-level pinning effect.

Figure 15:
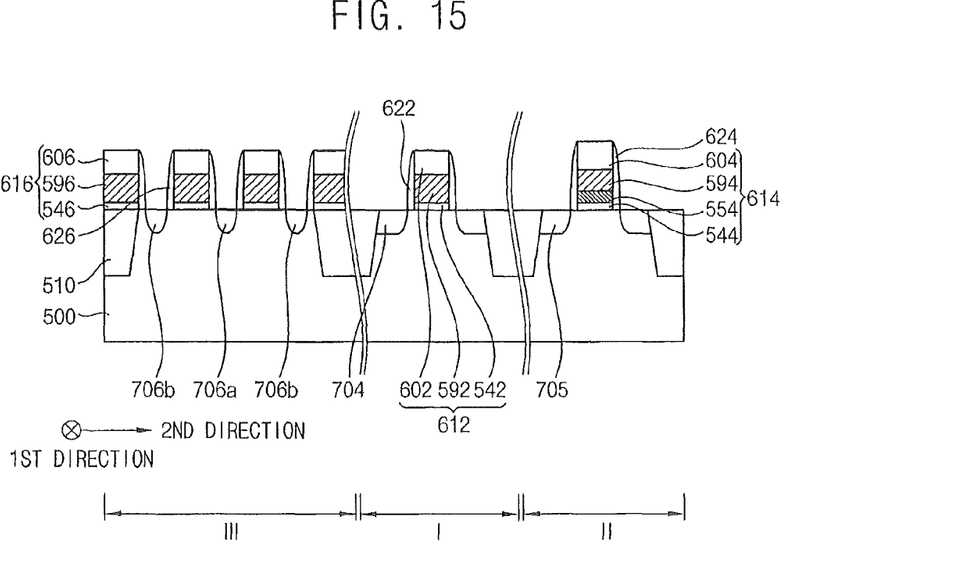

Referring to FIG. 15, the gate mask layer 600, the gate electrode layer 590, the diffusion barrier layer 550 and the gate insulation layers 547 and 548 may be sequentially patterned to form a first gate structure 612, a second gate structure 614 and a third gate structure 616 on the substrate 500 in the first to third regions I, II and III, respectively. In some embodiments, a plurality of first gate structures 612 may be formed in a second direction, a plurality of second gate structures 614 may be formed in the second direction, and a plurality of third gate structures 616 may be formed in the second direction. Each of the gate structures 612, 614 and 616 may extend in a first direction substantially perpendicular to the second direction. Each of the first gate structure 612 may include a first gate insulation layer pattern 542, a first gate electrode 592 and a first gate mask 602 sequentially stacked on the substrate 500 in the first region I, the second structure 614 may include a second gate insulation layer pattern 544, a diffusion barrier layer pattern 554, a second gate electrode 594 and a second gate mask 604 sequentially stacked on the substrate 500 in the second region II, and the third gate structure 616 may include a third gate insulation layer pattern 546, a third gate electrode 596 and a third gate mask 606 sequentially stacked on the substrate 500 in the third region III.

A first spacer 622, a second spacer 624 and a third spacer 626 may be formed on sidewalls of the first to third gate structures 612, 614 and 616, respectively. Particularly, a spacer layer (not shown) may be formed on the substrate 500 and the isolation layer 510 to cover the first and third gate structures 612, 614 and 616, and the spacer layer may be partially removed by an anisotropic etching process to form the first to third spacers 622, 624 and 626.

A first mask (not shown) may be formed on the substrate 500 in the second region II to cover the second gate structure 614. Impurities may be implanted into the substrate 500 in the first and third regions I and III using the first and third gate structures 612 and 616 and the first and third spacers 622 and 626 as ion implantation masks, so that a first impurity region 704 and a third impurity region 706 may be formed at upper portions of the substrate 500 adjacent to the first and third gate structures 612 and 616, respectively. The third impurity region 706 may include a first source/drain region 706a and a second source/drain region 706b. The impurities may be n-type impurities such as phosphorous or arsenic.

The first mask may be removed, and a second mask (not shown) may be formed on the substrate 500 in the first and third regions I and III to cover the first and third gate structures 612 and 616. Impurities may be formed into the substrate 500 in the second region II using the second gate structure 614 and the second spacer 624 as ion implantation masks to form a second impurity region 705 at upper portions of the substrate 500 adjacent to the second gate structure 614. Subsequently, the second mask may be removed.

Figure 16:
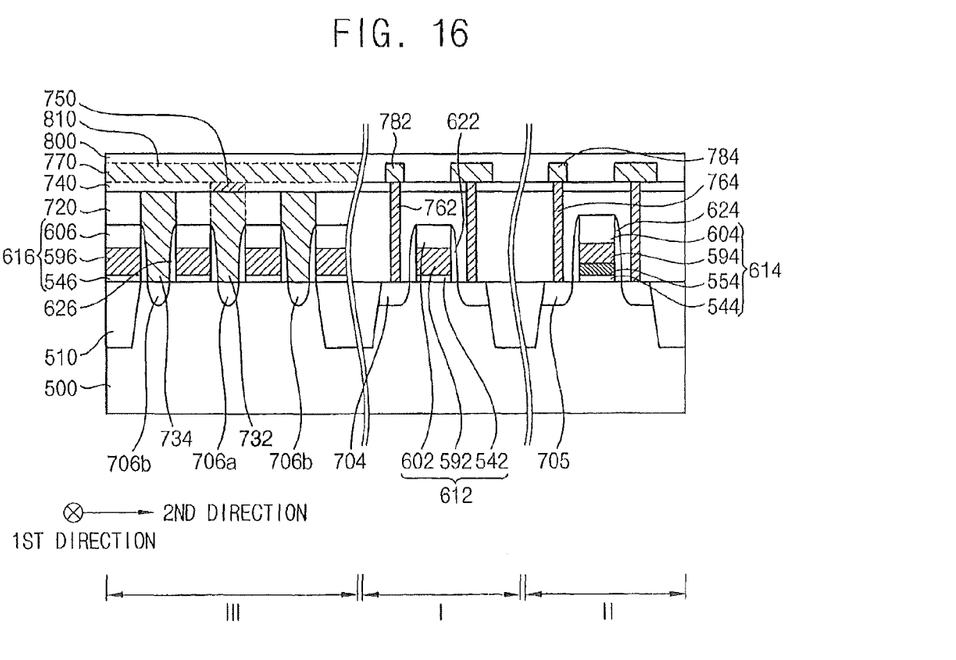

Referring to FIG. 16, a first insulating interlayer 720 may be formed on the substrate 500 to cover the gate structures 612, 614 and 616 and the spacers 622, 624 and 626. The first insulating interlayer 720 may be formed using an oxide such as borophosphor silicate glass (BPSG), undoped silicate glass (USG) and spin on glass (SOG).

First openings (not shown) may be formed through the first insulating interlayer 720 to expose the first and second source/drain regions 706a and 706b, and a first conductive layer (not shown) may be formed on the substrate 500 and the insulating interlayer 720 to sufficiently fill the openings. The first conductive layer may be formed using polysilicon doped with impurities, a metal, a metal nitride and/or a metal silicide. An upper portion of the first conductive layer may be planarized until an upper surface of the first insulating interlayer 720 is exposed to form first and second plugs 732 and 734 to which the first and second source/drain regions 706a and 706b may be electrically connected.

A second insulating interlayer 740 may be formed on the first insulating interlayer 720 and the first and second plugs 732 and 734. Second openings (not shown) may be formed through the second insulating interlayer 740 to expose the first plug 732 and the first and second impurity regions 704 and 705. A second conductive layer (not shown) may be formed on the substrate 500, the first plug 732 and the second insulating interlayer 740 to sufficiently fill the second openings. The second conductive layer may be formed using polysilicon doped with impurities, a metal, a metal nitride and/or a metal silicide. An upper portion of the second conductive layer may be planarized until an upper surface of the second insulating interlayer 740 is exposed to form a bitline contact plug 750, a third plug 762 and a fourth plug 764 which may be electrically connected to the first plug 732, the first impurity region 704 and the second impurity region 705, respectively.

A third conductive layer (not shown) may be formed on the second insulating interlayer 740 to contact the bitline contact plug 750 and the third and fourth plugs 762 and 764, and then may be patterned to form a bitline 770 to which the bitline contact 750 may be connected and first and second wirings 782 and 784 to which the third and fourth plugs 762 and 764 may be connected. In some embodiments, the bitline 770 may be formed to extend in the second direction. The third conductive layer may be formed using polysilicon doped with impurities, a metal, a metal nitride and/or a metal silicide.

A third insulating interlayer 800 may be formed on the second insulating interlayer 740 to cover the bitline 770, the first wiring 782 and the second wiring 784.

Figure 17:
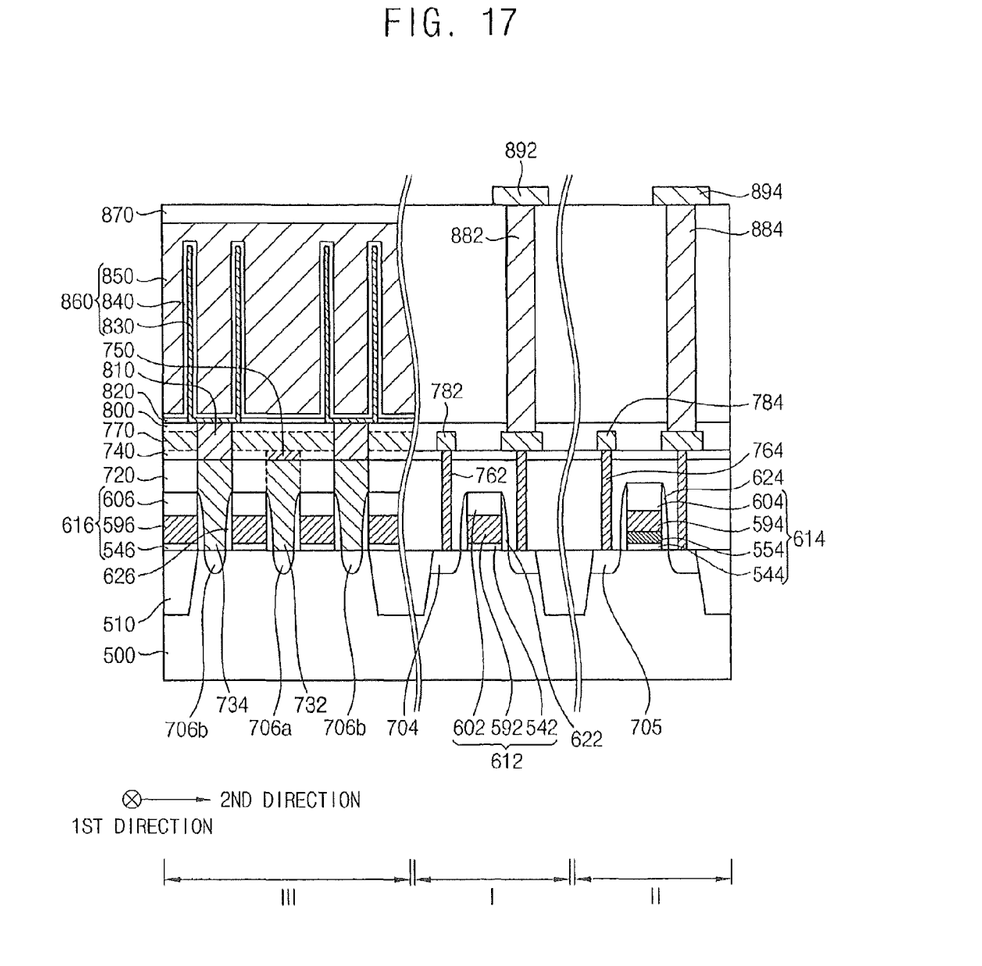

Referring to FIG. 17, third openings (not shown) may be formed through the second and third insulating interlayers 740 and 800 to expose the second plugs 734. The fourth conductive layer (not shown) may be formed on the second plugs 734 and the third insulating interlayer 800 to sufficiently fill the third openings. The fourth conductive layer may be formed using polysilicon doped with impurities, a metal, a metal nitride and/or a metal silicide. An upper portion of the fourth conductive layer may be planarized until an upper surface of the third insulating interlayer 800 is exposed to form capacitor contact plugs 810 to which the second plugs 734 may be electrically connected.

An etch-stop layer 820 and a mold layer (not shown) may be sequentially formed on the capacitor contact plugs 810 and the third insulating interlayer 800. In some embodiments, the etch-stop layer 820 may be formed using silicon nitride and the mold layer may be formed using silicon oxide. Fourth openings (not shown) may be formed through the mold layer and the etch-stop layer to expose the capacitor contact plugs 810. A fifth conductive layer (not shown) may be formed on bottoms and sidewalls of the fourth openings and the mold layer, and a sacrificial layer (not shown) may be formed on the fifth conductive layer to sufficiently fill the fourth openings. The fifth conductive layer may be formed using polysilicon doped with impurities, a metal, a metal nitride and/or a metal silicide. Upper portions of the sacrificial layer and the fifth conductive layer may be planarized until an upper surface of the mold layer is exposed, and then, the sacrificial layer may be removed. A lower electrode 830 may be formed on the bottoms and sidewalls of the fourth openings.

A dielectric layer 840 may be formed on the lower electrode 830 and the etch-stop layer 820. The dielectric layer 840 may be formed using silicon nitride or a high-k dielectric material having a dielectric constant higher than that of silicon nitride such as tantalum oxide, hafnium oxide, aluminum oxide or zirconium oxide.

An upper electrode 850 may be formed on the dielectric layer 840. The upper electrode 850 may be formed using polysilicon doped with impurities, a metal, a metal nitride and/or a metal silicide.

The lower electrode 830, the dielectric layer 840 and the upper electrode 850 may define a capacitor 860.

A fourth insulating interlayer 870 may be formed on the third insulating interlayer 800 to cover the capacitor 860. Fifth openings (not shown) may be formed through the fourth insulating interlayer 870 to expose the first and second wirings 782 and 784. A sixth conductive layer (not shown) may be formed on the first and second wirings 782 and 784 and the fourth insulating interlayer 870 to sufficiently fill the fifth openings. An upper portion of the sixth conductive layer may be planarized until an upper surface of the fourth insulating interlayer 870 to form fifth and sixth plugs 882 and 884 which may be electrically connected to the first and second wirings 782 and 784, respectively.

Third and fourth wirings 892 and 894 may be formed on the fourth insulating interlayer 870 to be electrically connected to the third and fourth wirings 892 and 894, respectively. A protection layer (not shown) may be further formed on the fourth insulating interlayer 870 to protect the third and fourth wirings 892 and 894, and thus the semiconductor device may be manufactured.

According to some embodiments, a diffusion barrier layer including a metal may be formed on a second portion of a PMOS region but not on a first portion of an NMOS region, and thus elements of a diffusion layer on the diffusion barrier layer and the gate insulation layer may be diffused only into the first portion of the gate insulation layer in the NMOS region. Thus, the NMOS transistor may have a low threshold voltage. Additionally, the remaining portion of the diffusion layer may be removed so that an electron mobility of channels of the transistors may not be reduced, thereby improving the operation speed of the transistors.

The foregoing is illustrative of some embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a first gate structure on a substrate, the first gate structure comprising:
      a first gate insulation layer pattern comprising a first element; and a first gate electrode on the first gate insulation layer pattern, wherein the first gate insulation layer pattern extends between the substrate and the first gate electrode, and the first gate electrode contacts an upper surface of the first gate insulation layer pattern and is substantially devoid of the first element; and a second gate structure on the substrate, the second gate structure comprising:
  a second gate insulation layer pattern, wherein the second gate insulation layer pattern is substantially devoid of the first element, and the first and second gate insulation layer patterns have a substantially equivalent thickness;
  a second gate electrode on the second gate insulation layer pattern, wherein the second gate insulation layer pattern extends between the substrate and the second gate electrode; and
  a diffusion barrier layer pattern between the second gate insulation layer pattern and the second gate electrode, wherein the second gate electrode directly contacts the diffusion barrier layer pattern and is substantially devoid of the first element.

2. The semiconductor device of claim 1, wherein the first element comprises lanthanum, yttrium, terbium, erbium, aluminum or tantalum.

3. The semiconductor device of claim 2, wherein the diffusion barrier layer pattern comprises titanium, titanium nitride, tungsten, tungsten nitride, tantalum, tantalum nitride, tantalum suicide or ruthenium.

4. The semiconductor device of claim 3, wherein:
  the first gate insulation layer pattern comprises a lower surface contacting the substrate; and
  the lower surface of the first gate insulation layer pattern is opposite the upper surface of the first gate insulation layer pattern.

5. The semiconductor device of claim 3, wherein:
  the first and second gate electrodes comprise respective first and second electrode layer patterns both of which comprise a first material; and
  the first electrode layer pattern contacts the upper surface of the first gate insulation layer pattern.

6. The semiconductor device of claim 5, wherein the second electrode layer pattern directly contacts the diffusion barrier layer pattern.

7. The semiconductor device of claim 6, wherein the first and second gate electrodes have a substantially equivalent thickness.

8. The semiconductor device of claim 5, wherein the first material comprises metal.

9. The semiconductor device of claim 8, wherein the first and second gate electrodes further comprise respective first and second silicon layer patterns on the first and second electrode layer patterns.

10. The semiconductor device of claim 9, wherein the first and second silicon layer patterns comprise amorphous silicon.

11. The semiconductor device of claim 1, wherein the first and second gate insulation layer patterns comprise metal oxide or metal silicon oxide.

12. The semiconductor device of claim 11, wherein the first and second gate insulation layer patterns comprise hafnium oxide, zirconium oxide, tantalum oxide, aluminum oxide, lanthanum oxide, hafnium silicon oxide, zirconium silicon oxide or tantalum silicon oxide.

13. The semiconductor device of claim 1, wherein each of the first and second gate insulation layer patterns comprises a high-k dielectric layer pattern on the substrate and a low-k dielectric layer pattern between the substrate and the high-k dielectric layer pattern.

14. The semiconductor device of claim 1, wherein:
  the first gate structure comprises a NMOS transistor; and
  the second gate structure comprises a PMOS transistor.

15. The semiconductor device of claim 14, wherein the first element comprises lanthanum or titanium.

16. The semiconductor device of claim 1, wherein:
  the first gate structure comprises a PMOS transistor; and
  the second gate structure comprises a NMOS transistor.

17. The semiconductor device of claim 16, wherein the first element comprises aluminum.

* * * * *